US010240030B2

(12) United States Patent
Gallucci et al.

(10) Patent No.: US 10,240,030 B2
(45) Date of Patent: Mar. 26, 2019

(54) ARTICLE COMPRISING A HIGH FLOW POLYETHERIMIDE COMPOSITION

(71) Applicant: SABIC Global Technologies B.V., Bergen op Zoom (NL)

(72) Inventors: Robert Russell Gallucci, Mt. Vernon, IN (US); Pamela J. Appel, Evansville, IN (US)

(73) Assignee: SABIC GLOBAL TECHNOLOGIES B.V., Bergen Op Zoom (NL)

( * ) Notice: Subject to any disclaimer, the term of this patent is extended or adjusted under 35 U.S.C. 154(b) by 585 days.

(21) Appl. No.: 14/558,141

(22) Filed: Dec. 2, 2014

(65) Prior Publication Data

US 2016/0152799 A1  Jun. 2, 2016

(51) Int. Cl.

| C08K 5/52 | (2006.01) |
|---|---|
| C08K 5/523 | (2006.01) |
| C08K 3/36 | (2006.01) |
| C08K 7/14 | (2006.01) |
| C08G 73/10 | (2006.01) |
| C08L 79/08 | (2006.01) |
| C08K 5/521 | (2006.01) |
| C08K 3/013 | (2018.01) |
| C08K 3/00 | (2018.01) |
| H05K 1/03 | (2006.01) |

(52) U.S. Cl.
CPC ............ *C08K 5/521* (2013.01); *C08K 3/0033* (2013.01); *C08K 3/013* (2018.01); *C08K 3/36* (2013.01); *C08K 5/523* (2013.01); *C08K 7/14* (2013.01); *H05K 1/0373* (2013.01); *H05K 2201/012* (2013.01)

(58) Field of Classification Search
CPC .............. C08G 73/1071; C08G 73/127; C08G 73/124; C08G 73/10; G08G 73/10; C08K 5/523; C08K 3/36; C08K 5/52; C08L 79/08
See application file for complete search history.

(56) References Cited

U.S. PATENT DOCUMENTS

| 4,061,487 A * | 12/1977 | Kiyonaga ................ C03B 5/14 264/30 |
|---|---|---|
| 4,404,350 A | 9/1983 | Ryang |
| 4,690,997 A | 9/1987 | Cella et al. |
| 4,808,686 A | 2/1989 | Cella et al. |
| 5,106,915 A | 4/1992 | Rock et al. |
| 5,300,812 A | 4/1994 | Lupinski et al. |
| 5,455,292 A | 10/1995 | Kakegawa et al. |
| 6,140,411 A | 10/2000 | Schwamborn et al. |
| 6,319,432 B1 * | 11/2001 | Harrod ...................... C07F 9/12 252/609 |
| 6,815,476 B1 | 11/2004 | Bhatia et al. |
| 7,652,107 B2 | 1/2010 | Gallucci et al. |
| 8,017,699 B1 | 9/2011 | Sanner et al. |

| 2007/0049706 A1 | 3/2007 | Siripurapu et al. |
|---|---|---|
| 2007/0299213 A1 | 12/2007 | Banerjee et al. |
| 2009/0306258 A1 | 12/2009 | Siripurapu et al. |
| 2010/0010128 A1 | 1/2010 | Levchik et al. |
| 2012/0021153 A1 | 1/2012 | Bhandari et al. |
| 2013/0331478 A1 * | 12/2013 | La Camera ........... C08K 5/0025 522/174 |
| 2014/0094536 A1 * | 4/2014 | Guggenheim ...... C08G 73/1021 521/180 |
| 2014/0171613 A1 * | 6/2014 | Stegall ................ C08G 73/1003 528/207 |
| 2014/0256861 A1 * | 9/2014 | Li ............................ C08K 5/523 524/127 |
| 2014/0326163 A1 | 11/2014 | Van Der Mee et al. |
| 2014/0329940 A1 | 11/2014 | Vander Mee et al. |
| 2014/0334090 A1 | 11/2014 | Shen et al. |
| 2016/0152827 A1 | 6/2016 | Galluci et al. |

FOREIGN PATENT DOCUMENTS

| NO | 2009105377 A2 | 8/2009 |
|---|---|---|
| WO | 9304109 | 8/1991 |
| WO | 9304109 | 3/1993 |
| WO | 2013148759 A1 | 10/2013 |
| WO | 2015106204 A1 | 7/2015 |

OTHER PUBLICATIONS

Final Office Action for U.S. Appl. No. 14/558,118, filed Dec. 2, 2014; dated Jun. 28, 2017; 17 pages.
Database CA [Online] Chemical Abstracts Service, Columbus, Ohio, US;Jul. 24, 2008, Shimura, Yuta et al: Fire and hydrolysis-resistant polymer compositions with good mechanical properties', XP002753156, retrieved from STN Database accession No. 2008 886204.
Database WPI Week 200856 Thomson Scientific, London, GB; AN 2008-J61021 XP002753157, JP 2008169363 A (Toray Ind Inc) Jul. 24, 2008 (Jul. 24, 2008) abstract.
International Search Report for International Application PCT/US2015/060847; International Filing Date: Nov. 16, 2015; dated Feb. 1, 2016; 6 pages.
International Search Report for International Application PCT/US2015/060877; International Filing Date: Nov. 16, 2015; dated Feb. 10, 2016; 6 pages.

(Continued)

*Primary Examiner* — Joanna Pleszczynska
(74) *Attorney, Agent, or Firm* — Cantor Colburn LLP (57) ABSTRACT

Molded articles having a maximum thickness of 3 centimeters and including a polyetherimide composition are described. The polyetherimide compositions include 60 to 99.9 weight percent of a polyetherimide having a weight average molecular weight of 5,000 to 80,000 Daltons, and 0.1 to 40 weight percent of an aryl phosphate having a molecular weight from 500 to 1,200 Daltons, wherein weight percent is based on the total weight of the composition. The compositions have a melt flow at least 10% greater than the melt flow of the same polyetherimide composition without the aryl phosphate, measured according to ASTM D1238 at 337° C. under a 6.7 kilogram load.

23 Claims, 1 Drawing Sheet

(56) References Cited

OTHER PUBLICATIONS

Written Opinion of the International Searching Authority for International Application No. PCT/US2015/060847; International Filing Date: Nov. 16, 2015; 6 pages.
Written Opinion of the International Searching Authority for International Application No. PCT/US2015/060877; International Filing Date: Nov. 16, 2015; 6 pages.
Alexandrino, Evandro M., et al., "Improvement of Processing and Mechanical Properties of Polyetherimide by Antiplasticization with Resorcinol Bis(diphenylphosphate)", Journal of Applied Polymer Science 2014, DOI: 10.1002/APP 40619, pp. 1-8.
Non Final Office Action for U.S. Appl. No. 14/558,118, filed Dec. 2, 2014; dated Mar. 2, 2017; 85 pages.
International Search Report for International Application No. PCT/IB2018/050213, International Filing Date Jan. 12, 2018, dated May 3, 2018, 5 pages.
Written Opinion for International Application No. PCT/162018/050213, International Filing Date Jan. 12, 2018, dated May 3, 2018, 6 pages.

* cited by examiner

ARTICLE COMPRISING A HIGH FLOW POLYETHERIMIDE COMPOSITION

BACKGROUND

Polyimides, specifically polyetherimides (PEI) are high performance polymers having high strength, heat resistance, and modulus, and broad chemical resistance. Polyetherimides are widely used in applications including automotive, telecommunications, aerospace, electrical/electronics, transportation, food service, and healthcare. There has been a significant interest in developing thermoplastic polymers that can resist burning. The use of phosphates as flame retardants for thermoplastic polymers is generally known, particularly the use of monophosphates, for example, triphenyl phosphate, tricresyl phosphate, diphenylcresyl phosphate, and the like. Such monophosphate esters tend to suffer from several drawbacks including migration to the surface during molding of the thermoplastic composition (often referred to as "juicing"). Furthermore, to achieve an acceptable level of flame retardancy, additional flame retardants are often employed in combination with the monophosphates, particularly halogen-containing flame retardants. Halogen-containing flame retardants are undesirable because of environmental concerns and pitting of the mold surface. If high concentrations of the above-mentioned phosphate esters are employed, a decrease in heat resistance and impact strength can result.

In addition to the flame retardant properties required for use in specific applications, polyetherimides meeting certain processing requirements are also of interest. For example, the melt flow rate of polyetherimide compositions is significantly lower compared to semicrystalline thermoplastic polymer composites, for example, polyphenylene sulfide, polyetheretherketone, and the like. There remain certain applications where an increased melt flow rate of polyetherimide compositions would be desirable. For example, in the rapidly developing area of portable hand-held electronic devices, there is a need for parts with very thin walls for applications including computer tablets and smart phones. Lower molecular weight polyetherimide can provide higher flow, but at the expense of other properties including impact strength. Thus there is a need for materials that will not only flow to fill such long, thin parts but will have increased modulus and strength to ensure that devices made from these parts will have sufficient rigidity to protect the electronics in the end use.

Accordingly, there remains a continuing need for improved polyetherimide thermoplastic compositions having the desired combination of improved melt flow rate and mechanical properties including improved elongation, higher strength, and higher impact, while maintaining acceptable levels of flame retardancy.

BRIEF DESCRIPTION

A molded article having a maximum thickness of 3 centimeters and comprising a polyetherimide composition is disclosed. The polyetherimide composition comprises 60 to 99.9 weight percent of a polyetherimide having a weight average molecular weight of 5,000 to 80,000 Daltons, and 0.1 to 40 weight percent of an aryl phosphate having a molecular weight from 500 to 1,200 Daltons, wherein weight percent is based on the total weight of the composition, and wherein the composition has a melt flow at least 10% greater than the melt flow of the same polyetherimide composition without the aryl phosphate, measured according to ASTM D1238 at 337° C. under a 6.7 kilogram load.

A polyetherimide composition is also disclosed, comprising 60 to 99.9 weight percent of a polyetherimide having a weight average molecular weight of 5,000 to 80,000 Daltons, and 0.1 to 40 weight percent of a bisphenol A bis (diphenyl phosphate), wherein weight percent is based on the total weight of the composition, and wherein the composition has a melt flow at least 10% greater than the melt flow of the same polyetherimide composition without the aryl phosphate, measured according to ASTM D1238 at 337° C. under a 6.7 kilogram load.

An article comprising the polyetherimide composition represents another aspect of the disclosure.

The above described and other features are exemplified by the following FIGURE and detailed description.

BRIEF DESCRIPTION OF THE DRAWINGS

The following FIGURE is an exemplary embodiment.

DETAILED DESCRIPTION

Described herein are polyetherimide compositions comprising a polyetherimide and an aryl phosphate having a molecular weight from 500 to 1200 Daltons (Da). The polyetherimide compositions can further comprise a reinforcing filler. The inventors hereof have discovered that the use of an aryl phosphate having a molecular weight from 500 to 1200 Da in a polyetherimide composition provides compositions that have excellent melt flow properties, as well as improved physical properties and flame retardancy. The polyetherimide compositions are particularly useful for applications requiring transparent articles, as the disclosed polyetherimide compositions further maintain good clarity.

The polyetherimide composition comprises a polyetherimide. The polyetherimides comprise more than 1, for example 10 to 1000, or 10 to 500, structural units of the formula wherein each R is the same or different, and is a substituted or unsubstituted divalent organic group, such as a $C_{6-20}$ aromatic hydrocarbon group or a halogenated derivative thereof, a straight or branched chain $C_{2-20}$ alkylene group or a halogenated derivative thereof, a $C_{3-8}$ cycloalkylene group or halogenated derivative thereof, in particular a divalent group of the formula wherein $Q^1$ is —O—, —S—, —C(O)—, —SO$_2$—, —SO—, —C$_y$H$_{2y}$— wherein y is an integer from 1 to 5 or a halogenated derivative thereof (which includes perfluoroalkylene groups), or —(C$_6$H$_{10}$)$_z$— wherein z is an integer from 1 to 4. In an embodiment R is m-phenylene or p-phenylene.

Further in formula (1), T is —O— or a group of the formula —O—Z—O— wherein the divalent bonds of the —O— or the —O—Z—O— group are in the 3,3', 3,4', 4,3', or the 4,4' positions. The group Z in —O—Z—O— of formula (1) is also a substituted or unsubstituted divalent organic group, and can be an aromatic C$_{6-24}$ monocyclic or polycyclic moiety optionally substituted with 1 to 6 C$_{1-8}$ alkyl groups, 1 to 8 halogen atoms, or a combination thereof, provided that the valence of Z is not exceeded. Exemplary groups Z include groups derived from a dihydroxy compound of the formula wherein R$^a$ and R$^b$ can be the same or different and are a halogen atom or a monovalent C$_{1-6}$ alkyl group, for example; p and q are each independently integers of 0 to 4; c is 0 to 4; and X$^a$ is a bridging group connecting the hydroxy-substituted aromatic groups, where the bridging group and the hydroxy substituent of each C$_6$ arylene group are disposed ortho, meta, or para (specifically para) to each other on the C$_6$ arylene group. The bridging group X$^a$ can be a single bond, —O—, —S—, —S(O)—, —SO$_2$—, —C(O)—, or a C$_{1-18}$ organic bridging group. The C$_{1-18}$ organic bridging group can be cyclic or acyclic, aromatic or non-aromatic, and can further comprise heteroatoms such as halogens, oxygen, nitrogen, sulfur, silicon, or phosphorous. The C$_{1-18}$ organic group can be disposed such that the C$_6$ arylene groups connected thereto are each connected to a common alkylidene carbon or to different carbons of the C$_{1-18}$ organic bridging group. A specific example of a group Z is a divalent group of the formula wherein Q is —O—, —S—, —C(O)—, —SO$_2$—, —SO—, or —C$_y$H$_{2y}$— wherein y is an integer from 1 to 5 or a halogenated derivative thereof (including a perfluoroalkylene group). In a specific embodiment Z is a derived from bisphenol A, such that Q in the above formula is 2,2-isopropylidene.

The polyetherimide optionally comprises up to 10 mole %, up to 5 mole %, or up to 2 mole % of units of the above formula wherein T is a linker of the formula

In some embodiments no units are present wherein R is of these formulas.

In some embodiments, the polyetherimide can be a polyetherimide sulfone. In some embodiments, the polyetherimides have no R groups containing sulfone groups, or no sulfone groups are present in the polyetherimide.

In an embodiment, R is m-phenylene or p-phenylene and T is —O—Z—O— wherein Z is a divalent group derived from the above described dihydroxy compound. Alternatively, R is m-phenylene or p-phenylene and T is —O—Z—O wherein Z is a divalent group derived from the above described dihydroxy compound and Q is 2,2-isopropylidene.

The polyetherimide can be prepared by any of the methods well known to those skilled in the art, including the reaction of an aromatic bis(ether anhydride) of the formula with an organic diamine of the formula wherein T and R are defined as described above.

Illustrative examples of bis(anhydride)s include 3,3-bis[4-(3,4-dicarboxyphenoxy)phenyl]propane dianhydride; 4,4'-bis(3,4-dicarboxyphenoxy)diphenyl ether dianhydride; 4,4'-bis(3,4-dicarboxyphenoxy)diphenyl sulfide dianhydride; 4,4'-bis(3,4-dicarboxyphenoxy)benzophenone dianhydride; 4,4'-bis(3,4-dicarboxyphenoxy)diphenyl sulfone dianhydride; 2,2-bis[4-(2,3-dicarboxyphenoxy)phenyl]propane dianhydride; 4,4'-bis(2,3-dicarboxyphenoxy)diphenyl ether dianhydride; 4,4'-bis(2,3-dicarboxyphenoxy)diphenyl sulfide dianhydride; 4,4'-bis(2,3-dicarboxyphenoxy)benzophenone dianhydride; 4,4'-bis(2,3-dicarboxyphenoxy)diphenyl sulfone dianhydride; 4-(2,3-dicarboxyphenoxy)-4'-(3,4-dicarboxyphenoxy)diphenyl-2,2-propane dianhydride; 4-(2,3-dicarboxyphenoxy)-4'-(3,4-dicarboxyphenoxy)diphenyl ether dianhydride; 4-(2,3-dicarboxyphenoxy)-4'-(3,4-dicarboxyphenoxy)diphenyl sulfide dianhydride; 4-(2,3-dicarboxyphenoxy)-4'-(3,4-dicarboxyphenoxy) benzophenone dianhydride; and, 4-(2,3-dicarboxyphenoxy)-4'-(3,4-dicarboxyphenoxy)diphenyl sulfone dianhydride, as well as various combinations thereof.

Examples of organic diamines include ethylenediamine, propylenediamine, trimethylenediamine, diethylenetriamine, triethylene tetramine, hexamethylenediamine, heptamethylenediamine, octamethylenediamine, nonamethylenediamine, decamethylenediamine, 1,12-dodecanediamine, 1,18-octadecanediamine, 3-methylheptamethylenediamine, 4,4-dimethylheptamethylenediamine, 4-methylnonamethylenediamine, 5-methylnonamethylenediamine, 2,5-dimethylhexamethylenediamine, 2,5-dimethylheptamethylenediamine, 2,2-dimethylpropylenediamine, N-methyl-bis(3-aminopropyl) amine, 3-methoxyhexamethylenediamine, 1,2-bis(3-aminopropoxy) ethane, bis(3-aminopropyl) sulfide, 1,4-cyclohexanediamine, bis-(4-aminocyclohexyl) methane, m-phenylenediamine, p-phenylenediamine, 2,4-diaminotoluene, 2,6-diaminotoluene, m-xylylenediamine, p-xylylenediamine, 2-methyl-4,6-diethyl-1,3-phenylene-diamine, 5-methyl-4,6-diethyl-1,3-phenylene-diamine, benzidine, 3,3'-dimethylbenzidine, 3,3'-dimethoxybenzidine, 1,5-diaminonaphthalene, bis(4-aminophenyl) methane, bis(2-chloro-4-amino-3,5-diethylphenyl) methane, bis(4-aminophenyl) propane, 2,4-bis(p-amino-t-butyl) toluene, bis(p-amino-t-butylphenyl) ether, bis(p-methyl-o-aminophenyl)benzene, bis(p-methyl-o-aminopentyl)benzene, 1,3-diamino-4-isopropylbenzene, bis(4-aminophenyl) sulfide, bis-(4-aminophenyl) sulfone, and bis(4-aminophenyl) ether. Combinations of these compounds can also be used. In some embodiments the organic diamine is m-phenylenediamine, p-phenylenediamine, sulfonyl dianiline, or a combination comprising one or more of the foregoing.

The polyetherimide can have a melt index of 0.1 to 10 grams per minute (g/min), as measured by American Society for Testing Materials (ASTM) D1238 at 340 to 370° C., using a 6.7 kilogram (kg) weight. In some embodiments, the polyetherimide has a weight average molecular weight ($M_w$) of 1,000 to 150,000 Daltons (Da), as measured by gel permeation chromatography, using polystyrene standards. In some embodiments the polyetherimide has an $M_w$ of 5,000 to 80,000 Da, specifically, 20,000 to 60,000 Da. Such polyetherimide polymers can have an intrinsic viscosity greater than 0.2 deciliters per gram (dl/g), or, more specifically, 0.35 to 0.7 dl/g as measured in m-cresol at 25° C.

The polyetherimide can be present in an amount of 60 to 99.9 weight percent, for example, 75 to 99.9 weight percent, for example, 90 to 99.9 weight percent, for example 95 to 99.9 weight percent, wherein weight percent is based on the total weight of the composition.

The polyetherimide composition comprises an aryl phosphate. For example, the polyetherimide composition comprises an aryl phosphate having a molecular weight from 500 to 1200 Da. In some embodiments, aryl phosphates having a molecular weight greater than 1500 Da, or greater than 1200 Da, are excluded from the polyetherimide compositions. The aryl phosphate can have a boiling point at atmospheric pressure of greater than or equal to 300° C. The aryl phosphates can be represented by the formula wherein $R_1$, $R_2$, $R_3$, and $R_4$ are independently a $C_{6-20}$ aryl or a $C_{6-20}$ alkaryl group, X is an arylene group, and m is 0 or 1. When the aryl phosphate is an aryl phosphate having a molecular weight from 500 to 1200 Da, n can be 1 to 5. For example, n can be 1. In some embodiments, the polyetherimide composition can exclude aryl phosphates having a molecular weight greater than 2000 Da, specifically, greater than 1500 Da, or no aryl phosphates having a molecular weight of greater than 2000 Da, specifically, greater than 1500 Da are present in the polyetherimide composition.

In the above formula, the aryl groups can be aryl or $C_{1-8}$ alkyl substituted aryl groups (alkaryl groups). For example, the aryl groups can be cresyl, phenyl, xylenyl, propylphenyl, and butylphenyl. The arylene group X can be derived from a dihydric compound, for example, resorcinol, hydroquinone, and bisphenol A. For example, the aryl phosphate can comprise bisphenol A diphosphates, resorcinol diphosphates, biphenol diphosphates, hydroquinone diphosphates, acetophenone bisphenol diphosphates, dihydroxy diphenyl ether diphosphates, or a combination comprising at least one of the foregoing. In one embodiment, the aryl groups $R_1$, $R_2$, $R_3$, and $R_4$ can be phenyl and the arylene group X can be bisphenol A. For example, the aryl phosphate can be bisphenol A bis(diphenyl phosphate) (BPADP), wherein n is 1, m is 1, X is bisphenol A and $R_1$, $R_2$, $R_3$, and $R_4$ are phenyl, and having a molecular weight of 693 Da. In another embodiment, the aryl groups $R_1$, $R_2$, $R_3$, and $R_4$ can be phenyl and the arylene group X can be resorcinol. For example, the aryl phosphate can be resorcinol bis(diphenyl phosphate) (RDP), wherein n is 1, m is 1, X is resorcinol, and $R_1$, $R_2$, $R_3$, and $R_4$ are phenyl, and having a molecular weight of 574 Da.

In some embodiments, aryl phosphates having only one aryl oxygen linkage for each aryl ring in the phosphate structure can be preferred over an aryl phosphate having two or more oxygen linkages per aryl ring. Examples of aryl phosphates having one aryl oxygen linkage per aryl ring can include bisphenol A bis(diphenyl phosphate), bisphenol A bis(dicresyl phosphate), bisphenol A bis(dixylyl phosphate), biphenyl bis(diphenyl phosphate), biphenyl bis(dicresyl phosphate) and combinations comprising at least one of the foregoing. Examples of aryl phosphates having two or more oxygen linkages per aryl ring can include resorcinol diphosphates and similar structures (e.g., hydroquinone bis(diphenyl)phosphate).

The aryl phosphate can be present in an amount of 0.1 to 40 weight percent, for example, 0.1 to 25 weight percent, for example, 0.1 to 10 weight percent, for example 0.1 to 5 weight percent, wherein weight percent is based on the total weight of the composition.

The polyetherimide composition can optionally further comprise a reinforcing filler. Reinforcing fillers can include mica, clay, feldspar, quartz, quartzite, perlite, tripoli, diatomaceous earth, aluminum silicate (mullite), synthetic calcium silicate, fused silica, fumed silica, sand, boron-nitride powder, boron-silicate powder, calcium sulfate, calcium carbonates (such as chalk, limestone, marble, and synthetic precipitated calcium carbonates) talc (including fibrous, modular, needle shaped, and lamellar talc), wollastonite, hollow or solid glass spheres, silicate spheres, aluminosilicate, kaolin, whiskers of silicon carbide, alumina, boron carbide, iron, nickel, or copper, continuous and chopped carbon fibers or glass fibers, molybdenum sulfide, zinc sulfide, barium titanate, barium ferrite, barium sulfate, heavy spar, $TiO_2$, aluminum oxide, magnesium oxide, particulate or fibrous aluminum, bronze, zinc, copper, or nickel, glass flakes, flaked silicon carbide, flaked aluminum diboride, flaked aluminum, steel flakes, as well as combinations comprising at least one of the foregoing reinforcing fillers. The reinforcing fillers can be coated with a layer of metallic material to facilitate conductivity, or surface treated with silanes to improve adhesion and dispersion with the polymer matrix. In some embodiments, the reinforcing filler can comprise glass fiber, carbon fiber, titanium dioxide, clay, talc, mica, silica, mineral filler, wollastonite, glass spheres, flaked glass, milled glass, carbon black, and combinations comprising at least one of the foregoing. For example, the reinforcing filler can comprise glass fibers.

Useful glass fibers can be formed from any type of known fiberizable glass composition, and include, for example, those prepared from fiberizable glass compositions commonly known as "E-glass," "C-glass," "D-glass," "R-glass," "S-glass," as well as E-glass derivatives that are fluorine-free and/or boron-free. Commercially produced glass fibers generally have nominal filament diameters of 4.0 to 35.0 micrometers (μm), and most commonly produced E-glass fibers can have a nominal filament diameter of 9.0 to 30.0 micrometers. For example, glass fibers can have a diameter of 9 to 20 μm, specifically 10 to 15 μm. The filaments can be made by standard processes, for example, by steam or air blowing, flame blowing and mechanical pulling. The filaments for polymer reinforcement can be made by mechanical pulling. A fiber having a non-round cross section can also be used. The glass fibers can be sized or unsized. In a specific embodiment, the reinforcing filler can be an E-glass fiber having a diameter of 5 to 20 micrometers, specifically 9 to 20 μm, and more specifically 10 to 15 μm. The glass fibers can have various cross-sectional shapes, for example, round, trapezoidal, rectangular, square, crescent, bilobal, trilobal, and hexagonal. In one embodiment, the glass can be soda free. Fibrous glass fibers comprising lime-alumino-borosilicate glass, known as "E" glass, can be especially useful. Glass fibers, when present, can greatly increase the flexural modulus and strength of the polyetherimide compositions. The glass fibers can be used in the form of chopped strands, having lengths of about ⅛ inch (3 mm) to about ½ inch (13 mm) In some embodiments, rovings can also be used. The glass fiber length in molded articles prepared from compositions comprising the glass fibers can be shorter than the above mentioned lengths, presumably due to fiber fragmentation during compounding of the composition. For example, the length of the glass fibers in a molded article can be less than about 2 millimeters (mm).

The fibers can optionally be treated with various coupling agents to improve adhesion to the polymeric matrix. Examples of coupling agents can include alkoxy silanes and alkoxy zirconates, amino-, epoxy-, amide- and mercapto-functionalized silanes, and organometallic coupling agents, including, for example, titanium- or zirconium-containing organometallic compounds.

In some instances, the composition comprises a reinforcing filler having 100 parts per million (ppm) or less of elements selected from the group consisting of mercury, lead, cadmium, tin, antimony, arsenic and thallium.

The reinforcing filler, when used, can be present in an amount of 1 to 50 weight percent, for example, 10 to 40 weight percent, for example, 15 to 30 weight percent, based on the total weight of the composition.

The polyetherimide can optionally further comprise a silica, for example a precipitated silica such as RUBBERSIL RS-150, sold by Rubbersil Ltd. When used, the silica can be present in an amount of 0.01 to 3.0 weight percent, for example 0.05 to 1 weight percent, for example, 0.1 to 0.5 weight percent, based on the total weight of the composition.

In addition to the above-described components, the polyetherimide composition can include various additives ordinarily incorporated into thermoplastic compositions, with the proviso that the additives are selected so as to not significantly adversely affect the desired properties of the polyetherimide composition, for example the melt flow, elongation, strength, impact, and flame retardant properties. Such additives can be mixed at a suitable time during the mixing of the components for forming the composition. Additives can include impact modifiers, fillers, antioxidants, heat stabilizers, light stabilizers, ultraviolet (UV) light stabilizers, lubricants, mold release agents, antistatic agents, colorants such as such as titanium dioxide, carbon black, and organic dyes, surface effect additives, radiation stabilizers, flame retardants, and anti-drip agents. A combination of additives can be used, for example a combination of a heat stabilizer, mold release agent, and ultraviolet light stabilizer. The additives are used in the amounts generally known to be effective. For example, the total amount of the additives (other than any impact modifier, filler, or reinforcing agents) can be 0.01 to 5 weight percent based on the total weight of the polyetherimide composition.

The polyetherimide composition can optionally further include other polymeric additives for example thermoplastic polymers including polycarbonates (e.g., bisphenol A polycarbonate), polyester-carbonates, polyesters, polysulfones, and polyamides. In some embodiments, no additional thermoplastic polymers are included, or thermoplastic polymers other than the polyetherimide can be excluded from the polyetherimide composition.

In some embodiments, the thermoplastic composition can be essentially free of halogens, for example, fluorine, chlorine, and/or bromine. "Essentially free of fluorine, chlorine and bromine" is defined as having a fluorine and/or bromine and/or chlorine content of less than or equal to 100 parts per million by weight (ppm), less than or equal to 75 ppm, or less than or equal to 50 ppm, based on the total parts by weight of the composition.

The polyetherimide compositions can be manufactured by various methods according to general techniques which are known. The polyetherimide compositions described herein can generally be made by melt-blending the components using any known methods. For example, a polyetherimide and an aryl phosphate, and other optional components can be first blended in a HENSCHEL-Mixer® high speed mixer. Other low shear processes, including but not limited to hand-mixing, can also accomplish this blending. The blend can then be fed into a twin-screw extruder via a hopper. Alternatively, at least one of the components can be incorporated into the composition by feeding directly into the extruder at the throat and/or downstream through a side-stuffer. Additives can also be compounded into a master-batch containing the desired polyetherimide and fed into the extruder. Generally, the polyetherimide compositions can be melt-processed at temperatures of 240 to 340° C. The extrudate can be quenched in a water bath and pelletized. The pellets so prepared can be one-fourth inch long or less as desired. Such pellets can be used for subsequent molding, shaping, or forming.

The compositions of the present disclosure can be formed into articles using any suitable techniques, for example, melt-processing techniques. Commonly used melt-molding methods can include injection molding, extrusion molding, blow molding, rotational molding, coining, and injection blow molding. For example, the melt molding method can be injection molding. The compositions of the present disclosure can be formed into sheets and both cast and blown films by extrusion. These films and sheets can be further thermoformed into articles and structures that can be oriented from the melt or at a later stage in the processing of the composition. The compositions can be over-molded onto an article made from a different material and/or by a different process. The articles can also be formed using techniques such as compression molding or ram extruding. The articles can be further formed into other shapes by machining. Exemplary articles can include electrical meters, electrical motors, reflectors, profile extrusion, sheets and films, sight glasses, tubing, dial faces, electrical connectors, circuit boards or circuit board components, communications devices, and components of hand-held electronic devices. Hand-held electronic devices can include phones, tablets, computers, and components thereof. Components of hand-held electronic devices can include display screens or housings. In these applications, the combination of high melt flow and increased stiffness (i.e., modulus) and strength are especially valuable as electronic devices become thinner. For example, thin, light-weight cell phones or computer tablets must be rigid enough so as not to flex excessively, thereby causing damage to the electronic components.

In a specific embodiment, the article is a thin article, for example a housing for an electronic device, the thin article having a maximum thickness of 3 centimeters (cm), 2.5 cm, 2 cm, 1 cm, 0.5, or 0.2 cm. At least some portion of the article can have a thickness of 0.1 to 5.0 millimeters (mm), for example, at least some portion of the article can have a thickness of 0.1 to 2.0 mm. The article can have a length that is at least 10 times the thickness, for example, the length of the article can be at least 100 times the thickness. In some embodiments, the longest aspect of the article can be at least 5 cm.

The polyetherimide compositions have no limitation of the utilization field thereof for molded articles. The polyetherimide compositions can be advantageously used in applications where a combination of improved melt flow and enhanced physical properties including impact strength and thermal stability and flame retardancy are required. The polyetherimide compositions can further be advantageously used in applications where transparent articles are required.

The articles prepared from the compositions of the present disclosure can be used in applications including consumer goods, office equipment, computers, electronic or communication devices, automotive parts, domestic or industrial machine tools, lawn equipment, and domestic appliances. The term "automotive" refers to applications with respect to any vehicle of transportation, for example cars, trucks, motorcycles, scooters, motor bicycles, boats, and sport vehicles. The articles can include a wide array of devices, or components of a device, for a variety of industries and applications for example, electrical, communication, transportation, medical, information management, material handling, manufacturing, food service, storage, industrial applications, and personal care products. The articles can have snap fit connectors to facilitate attachment to more complex devices. The articles can also have holes or apertures.

The polyetherimide composition can have a melt flow at least 10% greater than the melt flow of the same polyetherimide composition without the aryl phosphate, measured according to ASTM D1238 at 337° C. under a 6.7 kilogram load.

In some embodiments, the polyetherimide composition can have a change in melt flow at 340° C. over 30 minutes of less than 15% of the original melt flow value when an aryl phosphate having only one aryl oxygen linkage for each aryl ring in the phosphate structure is used.

A molded sample of the polyetherimide composition can have a tensile modulus that is greater than the tensile modulus of a molded sample of the same polyetherimide composition without the aryl phosphate, measured according to ASTM D638. For example, a molded sample of the polyetherimide composition not including a glass fiber reinforcing filler can have a tensile modulus greater than or equal to 3750 megapascals (MPa), or greater than or equal to 3800 MPa. When a molded sample of the polyetherimide composition includes a glass fiber reinforcing filler, the molded sample can have a tensile modulus greater than or equal to 7000 MPa, or greater than or equal to 10,000 MPa.

A molded sample of the polyetherimide composition can have a percent transmission greater than or equal to 55%, preferably greater than or equal to 58%, more preferably greater than or equal to 60%, and a percent haze less than or equal to 5%, preferably less than or equal to 3%, more preferably less than or equal to 2%, each measured at 3.2 millimeters according to ASTM D1003.

A molded sample of the polyetherimide composition can have a total average flame out time of less than or equal to 3.6 seconds, preferably less than or equal to 3.0 seconds, measured according to Underwriters Laboratory test bulletin UL94 using 1.6 millimeter samples.

The polyetherimide composition can have a glass transition temperature of greater than or equal to 190° C., preferably greater than or equal to 195° C., more preferably greater than or equal to 200° C.

The polyetherimide composition can have a melt viscosity rate of greater than or equal to 5.0 cubic centimeters per 10 minutes (cc/10 minutes) at 337° C. using a 6 minute equilibration time and a 6.7 kilogram load, and a melt viscosity rate using an 18 minute equilibration time of less than 30% higher than the 6 minute melt viscosity rate measured under the same conditions.

A glass filled polyetherimide composition can have a tensile modulus that is increased by at least 5% compared to the tensile modulus of a polyetherimide composition without the aryl phosphate, according to ASTM D638. For example, a glass filled polyetherimide compositions can have a tensile modulus that is greater than or equal to 6500 MPa, or greater than or equal to 7000 MPa, or greater than or equal to 10000 MPa.

The polyetherimide compositions disclosed herein comprise an aryl phosphate, which yields compositions having improved melt flow, impact strength, thermal stability, and flame retardancy. The compositions further retain good clarity. Accordingly, the polyetherimide compositions can be used to prepare articles for a variety of applications. Therefore, a substantial improvement in polyetherimide compositions is provided.

The invention is further illustrated by the following non-limiting examples.

EXAMPLES

The materials shown in Table 1 were used in the examples.

TABLE 1

| Material | Description | Vendor |
|---|---|---|
| PEI | Polyetherimide comprising structural units derived from bisphenol A dianhydride and m-phenylene diamine, and having a weight average molecular weight ($M_w$) of 44,000 Daltons (Da); CAS Reg. No. 61128-46-9; obtained as ULTEM 1010. | SABIC |
| BPADP | Bisphenol A bis(diphenyl phosphate), CAS Reg. No. 5945-33-5 | ICL-IP America Inc. |
| RDP | Resorcinol bis(diphenyl phosphate), CAS Reg. No. 57583-54-7 | Chemtura Co. |
| GF | Glass fibers, obtained as OC165A, 11-micrometer diameter E-glass. | Owens Corning Fiberglas |
| Silica | Precipitated Silica, RUBBERSIL RS-150 | Rubbersil Ltd. |

Polyetherimide compositions were prepared by extrusion of a polyetherimide (ULTEM 1010) with an aryl phosphate, specifically, bisphenol A bis(diphenyl phosphate) (BPADP) and resorcinol bis(diphenyl phosphate) (RDP). Compositions were prepared using a 30 millimeter (mm) diameter co-rotating twin screw extruder with six barrel sections. The mixtures were prepared by mixing equal amounts of polyetherimide pellets and fine ground powders with the liquid phosphates. Polyetherimide pellets were first coated with the liquid aryl phosphates and mixed, and then a second portion of powdered polyetherimide polymer was added to the coated pellets. In some examples, chopped glass fibers were gently mixed into the compositions prior to extrusion. In glass filled compositions, a precipitated silica having a high surface area was further added to aid in the extrusion. All ingredients were fed into the throat of the extruder, however use of a pump to add the phosphate downstream from the feed throat is also contemplated.

Unfilled compositions were fed into a twin screw extruder having a screw speed of 250 revolutions per minute (rpm) and a barrel temperature of 250 to 330° C. The extruder was vented to the atmosphere, and no external vacuum was applied. Glass filled compositions were extruded using a 2.5 inch atmospheric-vented single screw extruder operating at 260 to 335° C., and having a screw speed of 75 rpm. The extrudates were cooled in a water bath prior to pelletizing. Pellets were dried at 150° C. for 4 hours prior to use for injection molding.

Test specimens were injection molded in accordance with ASTM test methods using an injection molding machine operating at a melt temperature of 200 to 360° C. and a mold temperature of 120° C. using a 30 second cycle time. All molded samples were conditioned for at least 48 hours at 50 percent relative humidity prior to testing. There was no migration of the aryl phosphates from the polyetherimide matrix during drying, molding or aging of the compositions.

Physical properties were measured according to ASTM test methods, using the following tests and test methods, as described below.

Melt volume-flow rate (MVR) was run on dried pellets in accordance with ASTM D1238 at 300 or 337° C. using a 6.7 kilogram load. MVR was measured as cc/10 minutes at 6 and 18 minute equilibration times. Higher values indicate higher melt flow.

Viscosity vs. shear rate (MVM) was run on a capillary rheometer at 340 and 300° C. according to ASTM D3835 using a shear rate of about 30 to 7000 seconds$^{-1}$. Lower values indicate higher melt flow.

Viscosity vs. time, also known as melt dwell or time sweep, was run using a parallel plate/cone-plate fixture rheometer at 300 or 340° C. for 30 minutes at a rate of 10 radians/second under nitrogen, according to ASTM D4440. Viscosity at the onset (after a 6 minute equilibration) and at the end of the test (30 minutes after equilibration) was compared to show the relative stability of the molten polymer.

Molecular weight was measured using gel permeation chromatography (GPC) according to ASTM D5296. Correction was made to exclude the lower molecular weight phosphate portion of the GPC curves. Polystyrene standards were used for calibration.

The glass transition temperature (Tg) was determined using differential scanning calorimetry (DSC) according to ASTM D3418 at a heating rate of 20° C. per minute. The Tg was recorded on the second heat.

Tensile properties were measured on 7.5×⅛ inch injection molded parts according to ASTM D638, and are reported as megapascals (MPa). Tensile modulus was measured as tangent, and tensile strength is reported at yield. Crosshead speed was 50 millimeters per minute for unfilled samples and 5 millimeters per minute for glass reinforced samples.

Flexural modulus and strength were measured on 3.2 millimeter injection molded bars according to ASTM D790 using a crosshead speed of 50 millimeter per minute.

Notched Izod (NI) and reversed notched Izod (RNI) impact strength were measured according to ASTM D256 using a 5 pound hammer on 63.5×12.7×3 2 mm thick injection-molded parts.

Heat distortion temperature (HDT) was measured on bars having a thickness of 3.2 millimeters under a load of 264 pounds per square inch (psi) with a heating rate of 120° C. per hour, according to ASTM D648.

Optical properties including percent transmission (% T), percent haze (% H) and yellowness index (YI), were measured on as-molded discs having a thickness of 3.2 millimeters according to ASTM D1003.

Dynamic mechanical analyses (DMA) were run on injection-molded bars having a thickness of 3.2 millimeters using a heating rate of 3° C. per minute at 1 Hertz in a flexural mode according to ASTM D5418. Tg was also recorded using this method.

Flammability tests were performed following the procedure of Underwriter's Laboratory Bulletin 94 entitled "Tests for Flammability of Plastic Materials, UL94." According to this procedure, materials may be classified as V-0, V-1, or V-2 on the basis of the test results obtained for samples of 1.6 millimeter thickness. The samples are made according to the UL94 test procedure using standard ASTM molding criteria. Samples were burned in a vertical orientation after conditioning for 48 hours at 23° C. in 50 percent relative humidity. At least 5 injection molded bars were burned for each UL test. For each bar, a flame was applied to the bar then removed, and the time required for the bar to self-extinguish (first afterflame time, t1) was noted. The flame was then reapplied and removed, and the time required for the bar to self-extinguish (second afterflame time, t2) and the post-flame glowing time (afterglow time, t3) were noted. To achieve a rating of V-0, the afterflame times t1 and t2 for each individual specimen must have been less than or equal to 10 seconds; and the total after flame time for all five specimens (t1 plus t2 for all five specimens) must have been less than or equal to 50 seconds; and the second afterflame time plus the afterglow time for each individual specimen (t2+t3) must have been less than or equal to 30 seconds; and no specimen can have flamed or glowed up to the holding clamp; and the cotton indicator cannot have been ignited by flaming particles or drops. To achieve a rating of V-1, the afterflame times t1 and t2 for each individual specimen must have been less than or equal to 30 seconds; and the total afterflame time for all five specimens (t1 plus t2 for all five specimens) must have been less than or equal to 250 seconds; and the second afterflame time plus the afterglow time for each individual specimen (t2+t3) must have been less than or equal to 60 seconds; and no specimen can have flamed or glowed up to the holding clamp; and the cotton indicator cannot have been ignited by flaming particles or drops. To achieve a rating of V-2, the afterflame times t1 and t2 for each individual specimen must have been less than or equal to 30 seconds; and the total afterflame time for all five specimens (t1 plus t2 for all five specimens) must have been less than or equal to 250 seconds; and the second afterflame time plus the afterglow time for each individual specimen (t2+t3) must have been less than or equal to 60 seconds; and no specimen can have flamed or glowed up to the holding clamp; but the cotton indicator can have been ignited by flaming particles or drops. Compositions not achieving a rating of V-2 were considered to have failed.

Compositions and properties are summarized in the Tables below, where component amounts are expressed in weight percent based on the total weight of the composition.

As illustrated by Examples 1 to 4 (E1-E4) in Table 2, polyetherimide compositions comprising an aryl phosphate can be extruded without surging, screw slippage, or vent flow. The aryl phosphate-containing compositions of Examples 1 to 4 show a surprising increase in melt flow relative to Comparative Example 1 (CE1), where Comparative Example 1 is a polyetherimide not having an aryl phosphate component. The melt flow at 337° C. was increased from 16.8 to 21.1-26.0 cubic centimeters per 10 minutes (cc/10 minutes) when an aryl phosphate was included, representing an increase of 26.6-54.8%. No major differences were noted for the melt flow recorded at 6 and 18 minutes. The MVR data indicates good melt flow stability of the polyetherimide compositions, which can facilitate the molding of parts requiring long cycle times. Specifically, the BPADP-containing compositions of Examples 1 and 2 showed surprisingly superior melt stability at processing temperatures (i.e., >300° C.) compared to the RDP-containing compositions of Examples 3 and 4. In terms of MVR, the BPADP-compositions showed less change between the 6 and 18 minute hold times at 337° C. than the more reactive RDP blends. Furthermore, the polyetherimide compositions including the aryl phosphate showed no significant molecular weight decrease, as determined using GPC relative to polystyrene standards. The compositions of Examples 1 to 4 also retained clarity, having percent transmission greater than 59% at 3.2 millimeters, and also showing relatively low haze (less than 2.0%). The tensile modulus of Examples 1 to 4 was slightly increased (3760-3890 megapascals (MPa)) compared to that of Comparative Example 1 (3730 MPa). The reversed notched Izod (RNI) impact strength was also increased from 735 joules per meter (J/m) for Comparative Example 1 to as much as 898 J/m for Example 3, having 1.5 percent aryl phosphate. The glass transition temperature of the polyetherimide compositions was slightly reduced, but remained above 200° C. even at the highest incorporation of aryl phosphate (3 weight percent). Thus, the large improvement in melt flow was unexpectedly accompanied by an increase in modulus and impact when an aryl phosphate was included in a polyetherimide composition, while clarity and thermal properties, for example, Tg, were retained.

Good ignition resistance as determined according to UL94 at 1.6 millimeters was noted for all the polyetherimide compositions, each achieving a V-0 rating. For the compositions of Examples 1 to 4 including the aryl phosphate, the average flame out time was reduced to less than 4 seconds.

TABLE 2

|  | CE1 | E1 | E2 | E3 | E4 |
|---|---|---|---|---|---|
| Component |  |  |  |  |  |
| PEI | 100 | 98.5 | 97.0 | 98.5 | 97.0 |
| BPADP |  | 1.5 | 3.0 |  |  |
| RDP |  |  |  | 1.5 | 3.0 |
| Properties |  |  |  |  |  |
| Visual inspection: part appearance | clear | clear | clear | clear | clear |
| MVR, 337° C., 6 minutes (cc/10 minutes) | 16.8 | 21.1 | 26.0 | 21.3 | 26.0 |
| MVR improvement (%) | — | 25.6 | 54.8 | 26.8 | 54.8 |
| MVR, 337° C., 18 minutes (cc/10 minutes) | 16.3 | 20.5 | 24.1 | 19.3 | 21.7 |
| $M_w$ by GPC (Daltons) | 46,666 | 46,276 | 45,695 | 46,073 | 46,209 |
| DSC Tg (° C.) | 218.4 | 211.1 | 203.6 | 209.1 | 200.1 |
| HDT (° C.) | 188.3 | 181.9 | 178.6 | 182.8 | 176.3 |
| Tensile Modulus (MPa) | 3730 | 3770 | 3840 | 3760 | 3890 |
| Tensile Strength at Yield (MPa) | 116 | 117 | 119 | 117 | 120 |
| Tensile Elongation at Break (%) | 12 | 15 | 15 | 21 | 10 |
| Tensile Modulus improvement (%) | — | 1.1% | 2.9% | 0.8% | 4.3% |
| Izod impact (Notched) (J/m) | 36.7 | 33.2 | 27.2 | 32.4 | 27.9 |
| Izod impact (Reverse Notched) (J/m) | 735 | 738 | 796 | 898 | 848 |
| Yellowness Index (YI) | 75.3 | 79.6 | 81.1 | 72.8 | 76.9 |
| Transmission (%) | 63.8 | 60.7 | 59.2 | 68.1 | 64.1 |

TABLE 2-continued

|  | CE1 | E1 | E2 | E3 | E4 |
|---|---|---|---|---|---|
| Haze (%) | 3.7 | 2.0 | 1.8 | 1.6 | 1.8 |
| UL-94 rating, 1.6 mm | V-0 | V-0 | V-0 | V-0 | V-0 |
| Total average flame out time (s) | 4.2 | 3.6 | 3.0 | 2.8 | 2.2 |

The compositions of Examples 1 to 4 were further characterized in terms of their viscosity vs. shear rate (MVM) at 340° C., and compared to the polyetherimide of Comparative Example 1, as shown in Table 3. The results show that a relatively low incorporation of 1.5 to 3.0 weight percent aryl phosphate allows for polyetherimide compositions having an improved melt flow (i.e., the compositions of Examples 1 to 4 exhibit a lower viscosity than Comparative Example 1) at a wide range of shear rates (e.g., from 29 to 7010 seconds$^{-1}$). These types of shear rates represent those which can be normally encountered in various melt forming processes, such as injection molding. The shear viscosities for each composition are reported as Pascal-seconds (Pa-s) in Table 3.

TABLE 3

| | Shear Viscosity (Pa-s) at 340° C. | | | | |
|---|---|---|---|---|---|
| Shear Rate (s$^{-1}$) | CE1 | E1 | E2 | E3 | E4 |
| 23 | 2547 | 2085 | 1644 | 2026 | 1673 |
| 50 | 2284 | 1910 | 1603 | 1832 | 1584 |
| 107 | 1826 | 1498 | 1234 | 1388 | 1199 |
| 198 | 1580 | 1334 | 1116 | 1309 | 1070 |
| 300 | 1346 | 1128 | 961 | 1066 | 936 |
| 500 | 1079 | 911 | 780 | 888 | 757 |
| 639 | 948 | 808 | 697 | 778 | 680 |
| 1004 | 740 | 640 | 559 | 620 | 542 |
| 1505 | 583 | 506 | 447 | 492 | 433 |
| 3007 | 390 | 329 | 292 | 321 | 286 |
| 5012 | 264 | 225 | 201 | 221 | 198 |
| 7016 | 205 | 177 | 159 | 177 | 159 |

Figure 1:
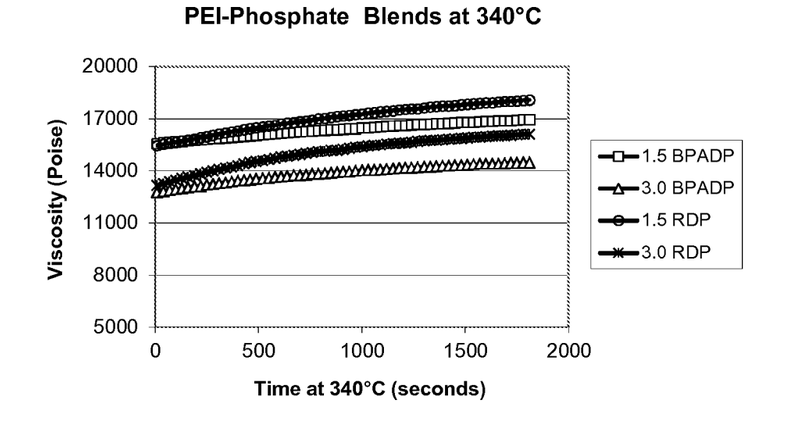
FIG. 1 shows RDP-containing compositions of Examples 3 and 4 (1.5 RDP and 3.0 RDP, respectively) have a much larger increase in the melt viscosity than the corresponding BPADP compositions of Example 1 and 2 (1.5 BPADP and 3.0 BPADP, respectively).

The melt stability of the compositions of Examples 1 to 4 were further analyzed by maintaining the compositions in the melt at 340° C. for 30 minutes while viscosity was continually measured, according to ASTM D4440. The results are provided in Table 4. Specifically, the compositions of Examples 1 and 2, comprising BPADP, were compared to the compositions of Examples 3 and 4, comprising RDP. This direct comparison of aryl phosphates demonstrates that some aryl phosphates can be preferred over others. Specifically, Table 4 and FIG. 1 show that RDP-containing compositions of Example 3 and 4 have a much larger increase in the melt viscosity than the corresponding BPADP compositions of Example 1 and 2. This large increase in melt viscosity is indicative of the compositions having less stability in the melt. Examples 1 and 2 showed less than a 15% change (8.9 and 13.3%, respectively) from the initial viscosity after 30 minutes at 340° C. In contrast, Examples 3 and 4 showed viscosity increases of 17.1 and 22.4% compared to the initial viscosities, illustrating less stability under melt processing conditions compared to the BPADP-containing counterparts.

TABLE 4

| | Viscosity (Poise) at 340° C. | | | |
|---|---|---|---|---|
| Time at 340° C. (s) | E1 | E2 | E3 | E4 |
| 10 | 15544 | 12753 | 15432 | 13143 |
| 300 | 15856 | 13271 | 16096 | 14057 |
| 600 | 16127 | 13644 | 16670 | 14783 |
| 900 | 16380 | 13913 | 17132 | 15225 |
| 1200 | 16591 | 14151 | 17505 | 15598 |
| 1500 | 16791 | 14333 | 17804 | 15874 |
| 1800 | 16931 | 14453 | 18064 | 16081 |
| % change from 10 to 1800 s | 8.9% | 13.3% | 17.1% | 22.4% |

Polyetherimide compositions further comprising chopped glass fibers were prepared and characterized. Precipitated silica (0.2 weight percent) was added to these compositions to allow for facile extrusion of the compositions. The glass-filled compositions and properties are summarized in Table 5, where component amounts are expressed in weight percent based on the total weight of the composition.

As illustrated by Examples 5-8 (E5-E8), glass-filled polyetherimide compositions comprising the aryl phosphate BPADP demonstrated improved melt flow relative to Comparative Examples 2 and 3 (CE2 and CE3), prepared without the aryl phosphate. A glass-filled polyetherimide composition comprising 15 weight percent glass fibers (Comparative Example 2) achieved a MVR of 11.8 cc/10 minutes, whereas further incorporating 1.5 and 3.0 weight percent BPADP (Examples 5 and 6) provided polyetherimide compositions having a MVR of 14.1 and 14.8 cc/10 minutes, respectively. When the glass content is increased to 30 weight percent as in Comparative Example 3, the MVR was 7.8 cc/10 minutes. Further adding 1.5 or 3.0 weight percent BPADP, as in Examples 7 and 8, respectively, provided polyetherimide compositions having increased MVR of 10.3 cc/10 minutes and 12.9 cc/10 minutes, respectively. The 6 minute and 18 minute dwell MVR for Examples 5 to 8 was also observed to effectively remain constant, indicating good melt stability of the compositions comprising the phosphate. The compositions of Examples 5 to 8 further showed no molecular weight loss by GPC. The glass transition temperature was reduced slightly, but remained above 195° C.

Examples 5 to 8 further showed a surprising increase in tensile and flexural modulus compared to what was observed for Comparative Examples 2 and 3, which lack the aryl phosphate. Good ignition resistance as determined according to UL94 at 1.6 millimeters was noted for all the glass-filled polyetherimide compositions, achieving a V-0 rating. For Examples 5 to 8 including the aryl phosphate, the average flame out time was reduced to less than 2.4 seconds. Examples 5, 6 and 8 all exhibited flame out time of less than or equal to 1.6 seconds.

TABLE 5

|  | CE2 | E5 | E6 | CE3 | E7 | E8 |
|---|---|---|---|---|---|---|
| Components |  |  |  |  |  |  |
| PEI (pellets) | 54.8 | 54.8 | 54.8 | 49.8 | 49.8 | 49.8 |
| PEI (fines) | 30 | 28.5 | 27 | 20 | 18.5 | 17 |
| GF | 15 | 15 | 15 | 30 | 30 | 30 |
| BPADP | 0 | 1.5 | 3 | 0 | 1.5 | 3 |
| Silica | 0.2 | 0.2 | 0.2 | 0.2 | 0.2 | 0.2 |
| Properties |  |  |  |  |  |  |
| MVR, 337° C., 6 minutes (cc/10 minutes) | 11.8 | 14.1 | 18.4 | 7.8 | 10.3 | 12.9 |
| MVR, 337° C., 18 minutes (cc/10 minutes) | 11.6 | 15.2 | 19.5 | 7.6 | 10.4 | 13.3 |
| MVR improvement (%) | — | 19.5 | 55.9 | — | 32.1 | 65.4 |
| $M_w$ by GPC | 44,858 | 47,012 | 46,718 | 44,046 | 46,116 | 46,642 |
| DSC Tg (° C.) | 217.0 | 209.3 | 199.4 | 217.0 | 206.1 | 195.3 |
| HDT (° C.) | 202.4 | 194.4 | 186.8 | 208.6 | 198.2 | 188.2 |
| Tensile Modulus (MPa) | 6240 | 7060 | 7150 | 10900 | 11700 | 12300 |
| Tensile Strength at Yield (MPa) | 122 | 132 | 136 | 163 | 160 | 168 |
| Tensile Modulus Increase (MPa) | — | 820 | 910 | — | 800 | 1400 |
| Tensile Modulus improvement (%) | — | 13.1 | 14.6 | — | 7.3 | 12.8 |
| Flexural Modulus (MPa) | 5030 | 5720 | 6160 | 8660 | 9380 | 9790 |
| Flexural Strength at Yield | 212 | 209 | 214 | 244 | 225 | 230 |
| Flexural Modulus Increase (MPa) | — | 690 | 1130 | — | 720 | 1130 |
| Flexural Modulus improvement (%) | — | 13.7 | 22.5 | — | 8.3 | 13.0 |
| Izod impact strength (Notched) (J/m) | 54 | 57 | 59 | 79 | 79 | 82 |
| Izod impact strength (Reverse Notched) (J/m) | 397 | 414 | 408 | 460 | 428 | 435 |
| UL94 rating, 1.6 mm | V-0 | V-0 | V-0 | V-0 | V-0 | V-0 |
| Total average flame out time (s) | 2.4 | 1.6 | 0.8 | 2.6 | 2.4 | 1.0 |

The compositions of Examples 5 to 8 were further characterized in terms of their viscosity vs. shear rate (MVM) at 340° C., and compared to the polyetherimide compositions of Comparative Examples 2 and 3. The results of this characterization are provided in Table 6, and show that a relatively low incorporation of 1.5 to 3.0 weight percent aryl phosphate allows for the glass-filled polyetherimide compositions to exhibit an improved melt flow (i.e., the compositions of Examples 5 to 8 exhibit a lower viscosity than Comparative Examples 2 and 3) at a wide range of shear rates (e.g., from 20 to 7010 seconds$^{-1}$). These types of shear rates represent those which can be normally encountered in various melt forming processes, such as injection molding.

TABLE 6

| | Shear Viscosity (Pa-s) 340° C. | | | | | |
|---|---|---|---|---|---|---|
| Shear Rate (s$^{-1}$) | CE2 | E5 | E6 | CE3 | E7 | E8 |
| 20 | 3523 | 2571 | 2406 | 4715 | 3355 | 3204 |
| 46 | 2707 | 2258 | 1761 | 4027 | 2723 | 2465 |
| 99 | 2183 | 1829 | 1443 | 3119 | 2308 | 2031 |
| 205 | 1672 | 1440 | 1180 | 2310 | 1771 | 1590 |
| 301 | 1496 | 1253 | 1072 | 1994 | 1580 | 1410 |
| 502 | 1191 | 1042 | 877 | 1607 | 1284 | 1124 |
| 641 | 1051 | 932 | 805 | 1391 | 1141 | 1010 |
| 1001 | 838 | 748 | 649 | 1094 | 913 | 822 |
| 1504 | 674 | 603 | 526 | 879 | 740 | 669 |
| 3006 | 442 | 400 | 352 | 567 | 478 | 442 |
| 5014 | 296 | 271 | 243 | 381 | 326 | 302 |
| 7014 | 248 | 219 | 199 | 309 | 263 | 237 |

The modulus of the glass-filled polyetherimide compositions of Examples 5 to 8 and Comparative Examples 2 and 3 was determined using DMA at various temperatures (30, 60, 90, 120, 150, and 180° C.), as shown in Table 7. The glass-filled polyetherimide compositions comprising the BPADP aryl phosphate demonstrated an increased modulus at all of the selected temperatures relative to Comparative Examples 2 and 3.

TABLE 7

| | Modulus (MPa) | | | | | |
|---|---|---|---|---|---|---|
| Temperature (° C.) | CE2 | E5 | E6 | CE3 | E7 | E8 |
| 30 | 3874 | 4353 | 4474 | 5823 | 6086 | 6279 |
| 60 | 3689 | 4180 | 4306 | 5644 | 5997 | 6121 |
| 90 | 3481 | 3962 | 4081 | 5422 | 5759 | 5908 |
| 120 | 3308 | 3775 | 3900 | 5238 | 5566 | 5724 |
| 150 | 3213 | 3668 | 3788 | 5129 | 5456 | 5602 |
| 180 | 3188 | 3619 | 3590 | 5080 | 5344 | 5211 |

As illustrated by Examples 9 to 12 (E9-E12), polyetherimide compositions can be prepared having relatively high amounts of an aryl phosphate, while retaining good clarity and flame retardant properties. The compositions of Examples 9 to 12 were prepared using a 30 millimeter diameter twin screw extruder, where the polyetherimide was added as a finely ground powder at the feed throat, and the BPADP was added downstream (about ¾ of the way downstream from the feed throat). The extruder was operated at a temperature of 225 to 340° C., and with a screw speed of 300 revolutions per minute and about 80% torque. As shown in Table 8, polyetherimide compositions having high amounts of BPADP (e.g., greater than 10 weight percent) retained high clarity, having greater than 60% transmission at 3.2 millimeters, and less than 3.7% haze. Examples 9 to 12 further demonstrate polyetherimide compositions having excellent flame resistance, achieving a UL94 rating of V-0, and having a total average flame out time of less than 2.5 seconds. Examples 11 and 12, having 15 and 20 weight percent BPADP, respectively, were observed to drip during the vertical burn test, however the drips were not flaming, and further did not ignite the cotton that was positioned under the burning bar in accordance with the UL94 test procedure.

Examples 9 to 12 surprisingly showed flow at 300° C. under a 2.16 kilogram load, an unexpected result for polyetherimide compositions having MVR ranging from 2.0 to 19.4 cc/10 minutes. MVR for each Example was also observed to be stable, showing less than a 20% change when held for 18 minutes at constant temperature compared to the initial 6 minute MVR values. This result indicates that there is no chemical reaction occurring between the polyetherimide and the phosphate that could lead to molecular weight increases and branching. The lack of reactivity is further supported by the GPC determination of molecular weight, where the weight average molecular weight ($M_w$) showed little to no change, even with increasing amounts of BPADP.

Addition of BPADP surprisingly led to increased tensile modulus even in the absence of glass fibers or other reinforcing filler, and for example, in Examples 10 to 12, a tensile modulus above 3600 MPa was achieved. A similar phenomenon was observed with respect to the flexural modulus, where a flexural modulus greater than 3600 MPa was achieved for Examples 10 to 12.

Thermal gravimetric analysis of the compositions demonstrated that the high molecular weight phosphate, BPADP (692 Da), can be retained by the composition, with only less than 1 percent weight loss at over 380° C. TGA of the samples was run under nitrogen using a 20° C. per minute heating rate.

TABLE 8

| | E9 | E10 | E11 | E12 |
|---|---|---|---|---|
| Components | | | | |
| PEI | 95 | 90 | 85 | 80 |
| BPADP | 5 | 10 | 15 | 20 |
| Properties | | | | |
| MVR, 300° C., 6 minutes (cc/10 minutes) | 2.0 | 5.3 | 10.7 | 19.4 |
| MVR, 300° C., 18 minutes (cc/10 minutes) | 2.0 | 4.7 | 10.4 | 20.2 |
| $M_w$ by GPC | 46,239 | 46,400 | 46,376 | 46,305 |
| $M_n$ by GPC | 20,945 | 20,890 | 20,767 | 20,552 |
| TGA, 1% weight loss (° C.) | 412 | 400 | 383 | 389 |
| TGA, 5% weight loss (° C.) | 515 | 487 | 449 | 444 |
| Flexural Modulus (MPa) | 3480 | 3650 | 3770 | 3830 |
| Flexural Strength at Yield (MPa) | 176 | 182 | 184 | 185 |
| Tensile Modulus (MPa) | 3450 | 3530 | 3636 | 3724 |
| Tensile Strength at Yield (MPa) | 116 | 118 | 119 | 118 |
| Yellowness Index (YI) | 75.9 | 73.9 | 74.6 | 69.0 |
| Transmission (%) | 62.5 | 63.4 | 61.8 | 65.8 |
| Haze (%) | 3.7 | 2.0 | 2.8 | 2.1 |
| UL94, 1.6 mm | V-0 | V-0 | V-0 | V-0 |
| Total average flame out time (s) | 1.6 | 2.1 | 2.3 | 1.5 |
| Number of drips per 5 bars | 0/5 | 0/5 | 3/5 | 3/5 |

The viscosity of the compositions of Examples 9 to 12 was tested over time at a temperature of 300° C. The compositions were held at this temperature in a rheometer under a shear rate of 10 radians per second, while the viscosity was monitored in a manner similar to the ASTM D4440 test method. The results, provided in Table 9, show that polyetherimide compositions having 5 to 20 weight percent BPADP (Examples 9 to 12) have no change in viscosity over time, retaining at least 90% of the initial viscosity. This result further indicates that no chemical reaction is occurring between the polyetherimide and the aryl phosphate. It was noted that the viscosity decreased with increasing amounts of aryl phosphate. For example, Example 9 having 5 weight percent BPADP had an initial viscosity of 46,826 Poise (P) at 300° C., whereas Example 10 having 10 weight percent BPADP had an initial viscosity of 21,058 P.

TABLE 9

| | Viscosity (P) | | | |
|---|---|---|---|---|
| Time at 300° C. (seconds) | E9 | E10 | E11 | E12 |
| 8 | 46,826 | 21,058 | 10,122 | 8,106 |
| 278 | 46,921 | 21,130 | 10,213 | 8,288 |
| 518 | 47,156 | 21,326 | 10,355 | 8,386 |
| 728 | 47,065 | 21,377 | 10,441 | 8,456 |
| 1028 | 47,289 | 21,608 | 10,590 | 8,592 |
| 1328 | 47,663 | 21,415 | 10,744 | 8,696 |
| 1568 | 47,495 | 21,913 | 10,808 | 8,771 |
| 1808 | 47,490 | 22,106 | 10,902 | 8,825 |

The polyetherimide compositions, methods of manufacture, and articles made therefrom are further illustrated by the following embodiments, which are non-limiting.

Embodiment 1

A molded article having a maximum thickness of 3 cm, comprising a polyetherimide composition, the composition comprising, 60 to 99.9 weight percent of a polyetherimide having a weight average molecular weight of 5,000 to 80,000 Daltons; and 0.1 to 40 weight percent of an aryl phosphate having a molecular weight from 500 to 1,200 Daltons; wherein weight percent is based on the total weight of the composition; and wherein the composition has a melt flow at least 10% greater than the melt flow of the same polyetherimide composition without the aryl phosphate, measured according to ASTM D1238 at 337° C. under a 6.7 kilogram load.

Embodiment 2

The molded article of embodiment 1, wherein a molded sample of the polyetherimide composition has a tensile modulus that is greater than the tensile modulus of a molded sample of the same polyetherimide composition without the aryl phosphate, measured according to ASTM D638.

Embodiment 3

The molded article of embodiments 1 or 2, wherein a molded sample of the polyetherimide composition has a tensile modulus of at least 3,800 MPa, measured according to ASTM D638.

Embodiment 4

The molded article of any one or more of embodiments 1 to 3, wherein a molded sample of the polyetherimide composition has a percent transmission greater than or equal to 55%, preferably greater than or equal to 58%, more preferably greater than or equal to 60%, and has a percent haze less than or equal to 5%, preferably less than or equal to 3%, more preferably less than or equal to 2%, measured at 3.2 millimeters according to ASTM D1003.

Embodiment 5

The molded article of any one or more of embodiments 1 to 4, wherein a molded sample of the polyetherimide composition has a total average flame out time of less than or equal to 3.6 seconds, preferably less than or equal to 3.0 seconds, measured according to Underwriters Laboratory test bulletin UL94 using 1.6 millimeter samples.

Embodiment 6

The molded article of any one or more of embodiments 1 to 5, wherein the composition has a glass transition temperature of greater than or equal to 190° C., preferably greater than or equal to 195° C., more preferably greater than or equal to 200° C.

Embodiment 7

The molded article of any one or more of embodiments 1 to 6, wherein the composition has a melt viscosity rate of greater than or equal to 5.0 cc/10 minutes at 337° C. using a 6 minute equilibration time and a 6.7 kilogram load, and a melt viscosity rate using an 18 minute equilibration time of less than 30% higher than the 6 minute melt viscosity rate measured under the same conditions.

Embodiment 8

The molded article of any one or more of embodiments 1 to 7, wherein the polyetherimide comprises units of the formula Wherein R is a $C_{2-20}$ hydrocarbon group, T is —O— or a group of the formula —O—Z—O— wherein the divalent bonds of the —O— or the —O—Z—O— group are in the 3,3', 3,4', 4,3', or the 4,4' positions, and Z is an aromatic $C_{6-24}$ monocyclic or polycyclic group optionally substituted with 1 to 6 $C_{1-8}$ alkyl groups, 1-8 halogen atoms, or a combination comprising at least one of the foregoing.

Embodiment 9

The molded article of embodiment 8, wherein R is a divalent group of the formula wherein $Q^1$ is —O—, —S—, —C(O)—, —SO$_2$—, —SO—, —$C_yH_{2y}$— and a halogenated derivative thereof wherein y is an integer from 1 to 5, or —$(C_6H_{10})_z$— wherein z is an integer from 1 to 4; and Z is a group derived from a dihydroxy compound of the formula wherein $R^a$ and $R^b$ are each independently a halogen atom or a monovalent $C_{1-6}$ alkyl group; p and q are each independently integers of 0 to 4; c is 0 to 4; and $X^a$ is a single bond, —O—, —S—, —S(O)—, —SO$_2$—, —C(O)—, or a $C_{1-18}$ organic bridging group.

Embodiment 10

The molded article of embodiments 8 or 9, wherein each R is independently meta-phenylene, para-phenylene, or a combination comprising at least one of the foregoing, and Z is 4,4'-diphenylene isopropylidene.

Embodiment 11

The molded article of any one or more of embodiments 1 to 10, wherein the polyetherimide comprises a polyetherimide sulfone.

Embodiment 12

The molded article of any one or more of embodiments 1 to 11, having a total chlorine and bromine content of 100 ppm or less and a total sodium content of 1000 ppm or less.

Embodiment 13

The molded article of any one or more of embodiments 1 to 12, wherein the aryl phosphate comprises bisphenol A diphosphates, resorcinol diphosphates, biphenol diphosphates, hydroquinone diphosphates, acetophenone bisphenol diphosphates, dihydroxy diphenyl ether diphosphates, or a combination comprising at least one of the foregoing.

Embodiment 14

The molded article of any one or more of embodiments 1 to 13, wherein the aryl phosphate is an aryl phosphate having one oxygen atom linkage for each aryl ring in the phosphate structure, and wherein the polyetherimide composition has a change in melt flow at 340° C. over 30 minutes of less than 15% of the original melt flow value.

Embodiment 15

The molded article of embodiment 14, wherein the aryl phosphate comprises bisphenol A bis(diphenyl phosphate).

Embodiment 16

The molded article of any one or more of embodiments 1 to 15, wherein the aryl phosphate has a boiling point at atmospheric pressure of greater than or equal to 300° C.

Embodiment 17

The molded article of any one or more of embodiments 1 to 16 comprising 95 to 99.9 weight percent of the polyetherimide; and 0.1 to 5 weight percent of the aryl phosphate.

Embodiment 18

The molded article of any one or more of embodiments 1 to 17, further comprising 1 to 50 weight percent, preferably 10 to 40 weight percent, more preferably 15 to 30 weight percent of a reinforcing filler comprising glass fiber, carbon fiber, titanium dioxide, clay, talc, mica, silica, mineral filler, wollastonite, glass spheres, flaked glass, milled glass, carbon black and combinations comprising at least one of the foregoing.

Embodiment 19

The molded article of embodiment 18, wherein the filler is an E-glass fiber having a diameter of 5 to 20 micrometers.

Embodiment 20

The molded article of embodiment 19 wherein the filler has 100 ppm or less of elements selected from the group consisting of mercury, lead, cadmium, tin, antimony, arsenic and thallium.

Embodiment 21

The molded article of any one or more of embodiments 18 to 20, wherein the tensile modulus is increased by at least 5% compared to the tensile modulus of a polyetherimide composition without the aryl phosphate, measured according to ASTM D638.

Embodiment 22

The molded article of any one or more of embodiments 18 to 21, wherein a molded sample of the polyetherimide composition has a tensile modulus of at least 7,000 MPa, measured according to ASTM D568.

Embodiment 23

The molded article of any one or more of embodiments 1 to 22, further comprising 0.01 to 3.0 weight percent, preferably 0.05 to 1 weight percent, more preferably 0.1 to 0.5 weight percent of a silica.

Embodiment 24

The molded article of any one or more of embodiments 1 to 23, wherein the article is an electrical connector, a circuit board or circuit board component, a computer, a display screen, a communication device, or a component of a hand-held electronic device.

Embodiment 25

A polyetherimide composition comprising 60 to 99.9 weight percent of a polyetherimide having a weight average molecular weight of 5,000 to 80,000 Daltons; and 0.1 to 40 weight percent of a bisphenol A bis(diphenyl phosphate); wherein weight percent is based on the total weight of the composition; and wherein the composition has a melt flow at least 10% greater than the melt flow of the same polyetherimide composition without the aryl phosphate, measured according to ASTM D1238 at 337° C. under a 6.7 kilogram load.

Embodiment 26

An article comprising the polyetherimide composition of embodiment 25.

Embodiment 27

The article of embodiment 26, wherein the article is an electrical connector, a circuit board or circuit board component, a computer, a display screen, a communication device, or a component of a hand-held electronic device.

Embodiment 28

The article of embodiments 26 or 27, wherein the article has a maximum thickness of 3 cm.

All ranges disclosed herein are inclusive of the endpoints, and the endpoints are independently combinable with each other. "Combination" is inclusive of blends, mixtures, alloys, reaction products, and the like. The terms "a" and "an" and "the" herein do not denote a limitation of quantity, and are to be construed to cover both the singular and the plural, unless otherwise indicated herein or clearly contradicted by context.

The term "alkyl" includes branched or straight chain, unsaturated aliphatic $C_{1-30}$ hydrocarbon groups e.g., methyl, ethyl, n-propyl, i-propyl, n-butyl, s-butyl, t-butyl, n-pentyl, s-pentyl, n- and s-hexyl, n- and s-heptyl, and, n- and s-octyl. "Alkenyl" means a straight or branched chain, monovalent hydrocarbon group having at least one carbon-carbon double bond (e.g., ethenyl (—HC=$CH_2$)). "Alkoxy" means an alkyl group that is linked via an oxygen (i.e., alkyl-O—), for example methoxy, ethoxy, and sec-butyloxy groups. "Alkylene" means a straight or branched chain, saturated, divalent aliphatic hydrocarbon group (e.g., methylene (—$CH_2$—) or, propylene (—$(CH_2)_3$—)). "Cycloalkylene" means a divalent cyclic alkylene group, —$C_nH_{2n-x}$, wherein x represents the number of hydrogens replaced by cyclization(s). "Cycloalkenyl" means a monovalent group having one or more rings and one or more carbon-carbon double bonds in the ring, wherein all ring members are carbon (e.g., cyclopentyl and cyclohexyl). The term "aryl" means an aromatic hydrocarbon group containing the specified number of carbon atoms, such as to phenyl, tropone, indanyl, or naphthyl. The prefix "halo" means a group or compound including one more of a fluoro, chloro, and bromo and iodo substituent. A combination of different halo groups (e.g., bromo and fluoro) can be present. In an embodiment only chloro groups are present. The prefix "hetero" means that the compound or group includes at least one ring member that is a heteroatom (e.g., 1, 2, or 3 heteroatom(s)), wherein the heteroatom(s) is each independently N, O, S, or P. "Substituted" means that the compound or group is substituted with at least one (e.g., 1, 2, 3, or 4) substituents independently selected from, a $C_{1-9}$ alkoxy, a $C_{1-9}$ haloalkoxy, a nitro (—$NO_2$), a cyano (—CN), a $C_{1-6}$ alkyl sulfonyl (—S(=O)$_2$-alkyl), a $C_{6-12}$ aryl sulfonyl (—S(=O)$_2$-aryl) a thiol (—SH), a thiocyano (—SCN), a tosyl ($CH_3C_6H_4SO_2$—), a $C_{3-12}$ cycloalkyl, a $C_{2-12}$ alkenyl, a $C_{5-12}$ cycloalkenyl, a $C_{6-12}$ aryl, a $C_{7-13}$ arylalkylene, a $C_{4-12}$ heterocycloalkyl, and a $C_{3-12}$ heteroaryl instead of hydrogen, provided that the substituted atom's normal valence is not exceeded.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

We claim:

1. A molded article having a maximum thickness of 3 cm, comprising a polyetherimide composition, the composition comprising,
   60 to 99.9 weight percent of a polyetherimide having a weight average molecular weight of 5,000 to 80,000 Daltons; and
   0.1 to 40 weight percent of an aryl phosphate having a molecular weight from 500 to 1,200 Daltons;
   wherein weight percent is based on the total weight of the composition;
   wherein the polyetherimide composition excludes aryl phosphates having a molecular weight greater than 2,000 Daltons;
   wherein thermoplastic polymers other than the polyetherimide are excluded from the composition;
   wherein the composition has a melt volume-flow rate of greater than or equal to 5.0 cc/10 minutes at 337° C. using a 6 minute equilibration time and a 6.7 kilogram load, and a melt volume-flow rate using an 18 minute equilibration time of less than 30% higher than the 6 minute melt volume-flow rate measured under the same conditions.

2. The molded article of claim 1, wherein a molded sample of the polyetherimide composition has a tensile modulus of at least 3,800 MPa, measured according to ASTM D638.

3. The molded article of claim 1, wherein a molded sample of the polyetherimide composition has a percent transmission greater than or equal to 55%, and has a percent haze less than or equal to 5%, measured at 3.2 millimeters according to ASTM D1003.

4. The molded article of claim 1, wherein a molded sample of the polyetherimide composition has a total average flame out time of less than or equal to 3.6 seconds measured according to Underwriters Laboratory test bulletin UL94 using 1.6 millimeter samples.

5. The molded article of claim 1, wherein the composition has a glass transition temperature of greater than or equal to 190° C.

6. The molded article of claim 1, wherein the polyetherimide comprises units of the formula wherein
R is a $C_{2-20}$ hydrocarbon group,
T is —O— or a group of the formula —O—Z—O— wherein the divalent bonds of the —O— or the —O—Z—O— group are in the 3,3', 3,4', 4,3', or the 4,4' positions, and
Z is an aromatic $C_{6-24}$ monocyclic or polycyclic group optionally substituted with 1 to 6 $C_{1-8}$ alkyl groups, 1-8 halogen atoms, or a combination comprising at least one of the foregoing.

7. The molded article of claim 6, wherein R is a divalent group of the formula -continued wherein
Q¹ is —O—, —S—, —C(O)—, —SO₂—, —SO—, —C_yH_{2y}— and a halogenated derivative thereof wherein y is an integer from 1 to 5, or —(C₆H₁₀)_z— wherein z is an integer from 1 to 4; and Z is a group derived from a dihydroxy compound of the formula wherein
$R^a$ and $R^b$ are each independently a halogen atom or a monovalent $C_{1-6}$ alkyl group;
p and q are each independently integers of 0 to 4;
c is 0 to 4; and
$X^a$ is a single bond, —O—, —S—, —S(O)—, —SO₂—, —C(O)—, or a $C_{1-18}$ organic bridging group.

8. The molded article of claim 6, wherein each R is independently meta-phenylene, para-phenylene, or a combination comprising at least one of the foregoing, and Z is 4,4'-diphenylene isopropylidene.

9. The molded article of claim 1, wherein the polyetherimide comprises a polyetherimide sulfone.

10. The molded article of claim 1, having a total chlorine and bromine content of 100 ppm or less and a total sodium content of 1000 ppm or less.

11. The molded article of claim 1, wherein the aryl phosphate comprises bisphenol A diphosphates, resorcinol diphosphates, biphenol diphosphates, hydroquinone diphosphates, acetophenone bisphenol diphosphates, dihydroxy diphenyl ether diphosphates, or a combination comprising at least one of the foregoing.

12. The molded article of claim 1, wherein the aryl phosphate is an aryl phosphate having one oxygen atom linkage for each aryl ring in the phosphate structure, and wherein the polyetherimide composition has a change in melt flow at 340° C. over 30 minutes of less than 15% of the original melt flow value.

13. The molded article of claim 12, wherein the aryl phosphate comprises bisphenol A bis(diphenyl phosphate).

14. The molded article of claim 1, wherein the aryl phosphate has a boiling point at atmospheric pressure of greater than or equal to 300° C.

15. The molded article of claim 1 comprising,
95 to 99.9 weight percent of the polyetherimide; and
0.1 to 5 weight percent of the aryl phosphate.

16. The molded article of claim 1, further comprising 1 to 50 weight percent of a reinforcing filler comprising glass fiber, carbon fiber, titanium dioxide, clay, talc, mica, silica, mineral filler, wollastonite, glass spheres, flaked glass, milled glass, carbon black and combinations comprising at least one of the foregoing.

17. The molded article of claim 16, wherein the filler is an E-glass fiber having a diameter of 5 to 20 micrometers.

18. The molded article of claim 17 wherein the filler has 100 ppm or less of elements selected from the group consisting of mercury, lead, cadmium, tin, antimony, arsenic and thallium.

19. The molded article of claim 16, wherein a molded sample of the polyetherimide composition has a tensile modulus of at least 7,000 MPa, measured according to ASTM D568.

20. The molded article of claim 1, further comprising 0.01 to 3.0 weight percent of a silica.

21. The molded article of claim 1, wherein the article is an electrical connector, a circuit board or circuit board component, a computer, a display screen, a communication device, or a component of a hand-held electronic device.

22. The molded article of claim 1, wherein the molded article has a length that is at least 10 times the thickness.

23. The molded article of claim 1, wherein the polyetherimide is prepared in the absence of a catalyst.

* * * * *